(12) United States Patent
Kim (10) Patent No.: US 8,012,385 B2
(45) Date of Patent: Sep. 6, 2011

(54) METHOD OF FORMING COLOR FILTER LAYER AND METHOD OF FABRICATING LIQUID CRYSTAL DISPLAY DEVICE USING THE SAME

(75) Inventor: Jin-Ook Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 1256 days.

(21) Appl. No.: 10/840,240

(22) Filed: May 7, 2004

(65) Prior Publication Data

US 2004/0229140 A1    Nov. 18, 2004

(30) Foreign Application Priority Data

May 16, 2003   (KR) .................. 10-2003-0031316

(51) Int. Cl.
*B29D 11/00* (2006.01)
(52) U.S. Cl. .............. 264/1.7; 264/5; 264/10; 264/79; 264/30; 264/97; 264/106; 264/107; 349/1; 349/2; 349/4; 349/11
(58) Field of Classification Search ............ 264/1.7, 264/5, 10, 79, 30, 91, 106, 107; 349/1, 2, 349/4, 11
See application file for complete search history.

(56) References Cited

U.S. PATENT DOCUMENTS

| | | | |
|---|---|---|---|
| 6,063,527 A * | 5/2000 | Nishikawa et al. | 430/7 |
| 6,989,177 B2 * | 1/2006 | Lin | 427/510 |
| 2001/0019382 A1 * | 9/2001 | Song et al. | 349/106 |

OTHER PUBLICATIONS

Younan Xia, et al. "Soft Lithography." *Angew. Chem. Int. Ed.*, 1998, pp. 550-575.

* cited by examiner

*Primary Examiner* — Christina Johnson
*Assistant Examiner* — Stella Yi
(74) *Attorney, Agent, or Firm* — Morgan, Lewis & Bockius LLP (57) ABSTRACT

The present invention relates to a liquid crystal display (LCD) device, and more particularly, to a method of fabricating a color filter for an LCD device.

A method of fabricating a color filter uses a mold (PDMS mold) having a plurality of grooves.

Particularly, the mold (PDMS mold) is attached to a substrate such that the plurality of grooves face into the substrate. When a color resin is dropped into a side opening of each groove, the color resin is injected into each groove of the mold (PDMS mold) by a capillary force.

After the mold (PDMS mold) having the injected color resin is cured, the mold (PDMS mold) is detached from the substrate and a color filter pattern is formed at a desired position.

As compared with a method of fabricating a color filter according to the related art, since an exposure step and an etching step are not required in a method of fabricating a color filter of the present invention, a method of fabricating a liquid crystal panel of high resolution does not have a limitation due to an exposure apparatus, and material cost and production time are reduced.

20 Claims, 9 Drawing Sheets

METHOD OF FORMING COLOR FILTER LAYER AND METHOD OF FABRICATING LIQUID CRYSTAL DISPLAY DEVICE USING THE SAME

The present invention claims the benefit of Korean Patent Application No. 2003-31316 filed in Korea on May 16, 2003, which is hereby incorporated by reference.

BACKGROUND OF THE INVENTION

1. Field of the Invention

The present invention relates to a method of fabricating a liquid crystal display device, and more particularly, to a method of forming a color filter layer for a liquid crystal display device.

2. Discussion of the Related Art

In general, a liquid crystal display device uses optical anisotropy and polarization properties of liquid crystal molecules to produce an image. For instance, the orientation of the liquid crystal molecules can be aligned in a specific direction controlled by an applied electric field. As the applied electric field changes, so does the alignment of the liquid crystal molecules. Due to the optical anisotropy of the liquid crystal, the refraction of incident light on the liquid crystal molecules also changes depending on the alignment direction of the liquid crystal molecules. Thus, by properly controlling an electric field applied to a group of liquid crystal molecules in respective pixels of a liquid crystal display device, a desired image can be produced by diffracting light.

There are many types liquid crystal displays (LCDs) and one of such types is an active matrix liquid crystal display (AM-LCD) having a matrix of pixels. AM-LCDs are the subject of significant research and development because of their high resolution and superiority in displaying moving images. In general, each of the pixels in an AM-LCD has a thin film transistor (TFT) and pixel electrode.

Figure 1:
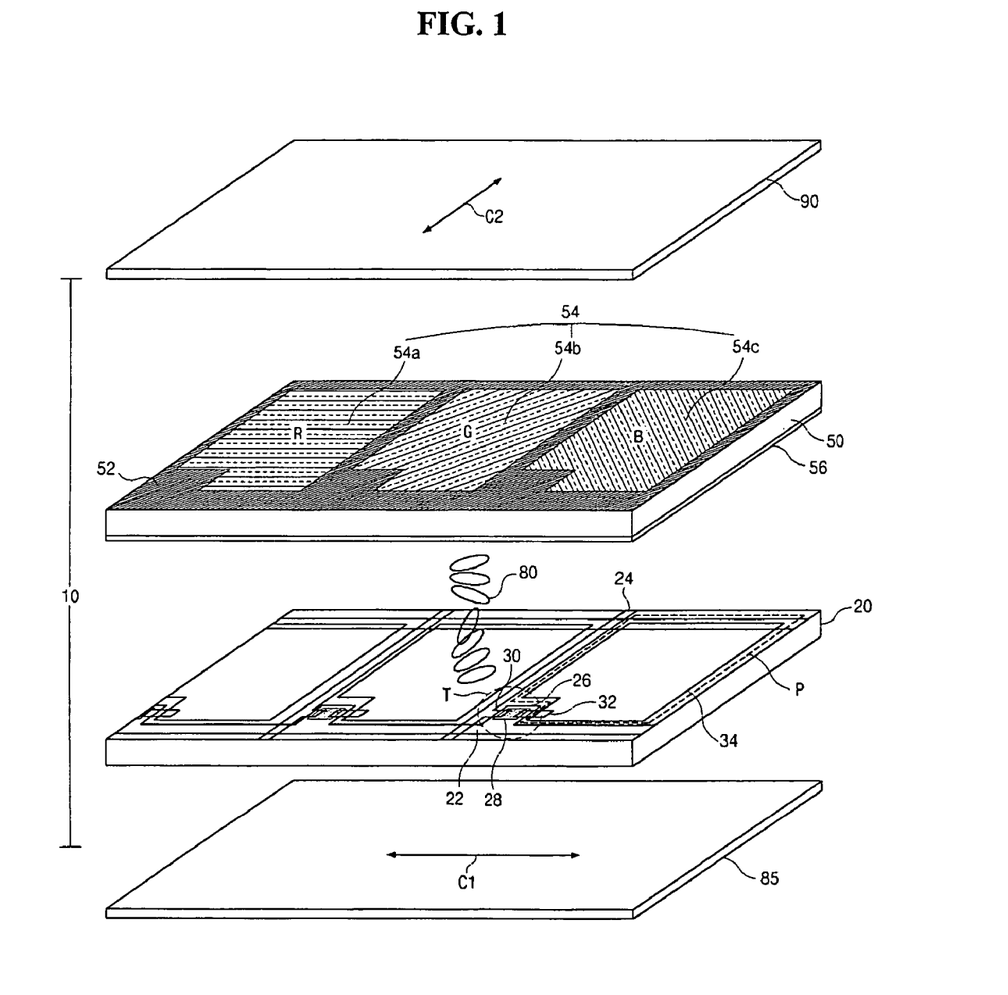
FIG. 1 is a schematic exploded perspective view of a twisted nematic (TN) mode liquid crystal display device according to the related art.

FIG. 1 is a schematic exploded perspective view of a twisted nematic (TN) mode liquid crystal display device according to the related art. In FIG. 1, a liquid crystal display device 10 includes a first substrate 20, a second substrate 50 spaced apart from the first substrate 20, and a liquid crystal layer 80 interposed between the first and second substrates 20 and 50. The first substrate 20 includes gate lines 22 and data lines 24. The crossing of the gate lines 22 and data lines 24 defines pixel regions "P" and each of the pixel regions "P" includes a thin film transistor "T." In addition, the TFT "T" includes a gate electrode 26 connected to the gate line 22, an active layer 28, a source electrode 30 connected to the data line 24, a drain electrode 32 spaced apart from the source electrode 30. A transparent pixel electrode 34 connected to the drain electrode 32 is formed in the pixel region "P."

The second substrate 50 includes a black matrix 52, a color filter layer 54 and a common electrode 56. The black matrix 52 is formed on the second substrate 50 corresponding to the gate lines 22, the data lines 24 and the TFT "T" on the first substrate 20. The black matrix 52 shields light from exterior and is formed of one of an opaque metal and an opaque resin. The color filter layer 54 includes red, green and blue sub-color filters 54a, 54b and 54c alternately disposed. Each sub-color filter corresponds one of the pixel regions "P" and is formed by coating, exposing and developing photosensitive resin.

A first linear polarizing plate 85 having a first polarization axis "C1" is formed outside the first substrate 20 and a second linear polarizing plate 90 having a second polarization axis "C2" perpendicular to the first polarization axis "C1" is formed outside the second substrate 50.

A longitudinal electric field is induced perpendicularly between the pixel electrode 34 and the common electrode 56 by voltages applied to the pixel electrode 34 and the common electrode 56. Such an electric field changes the alignment of the liquid crystal layer 80, thereby changing light transmittance of the liquid crystal layer 80. Thus, as light passes through the liquid crystal layer 80 and the color filter layer 54, desired color images are obtained.

The color filter layer 54 may be formed by various methods including, for example, an electro-deposition method, a dyeing method and a pigment dispersion method. In the electro-deposition method, a color filter layer is formed on an electrode using an electrochemical reaction. The electro-deposition method has superiority in large-sized LCD devices and a low consumption of materials. However, the color filter layer formed through the electro-deposition method has a great deviation in property according to process condition. In the dyeing method, a color filter layer is formed by dyeing a dyeable resin. The color filter layer formed through the dyeing method has low reliability for ultraviolet (UV) light and chemicals. Accordingly, the pigment dispersion method is more commonly used. In the pigment dispersion method, a color filter layer is formed by coating and exposing a material where polyimidic pigments are dispersed. The pigments are insoluble in the solvent.

FIGS. 2A to 2D are schematic perspective views showing a process of forming a color filter substrate for a liquid crystal display device according to the related art.

Figure 2A:
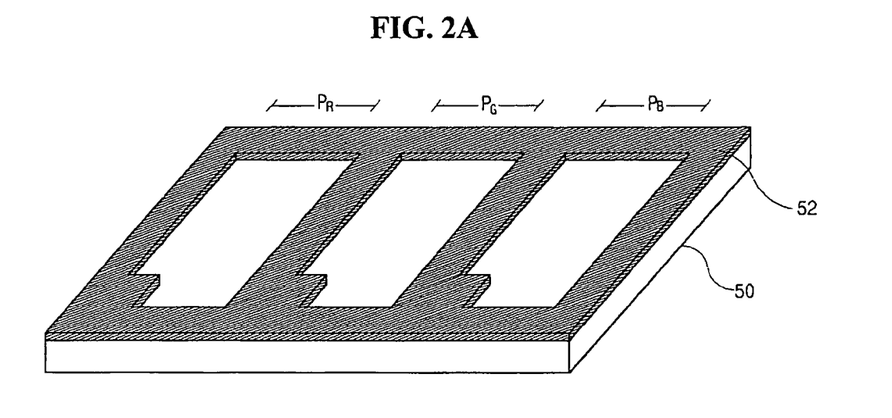
FIGS. 2A to 2D are schematic perspective views showing a process of forming a color filter substrate for a liquid crystal display device according to the related art.

In FIG. 2A, a black matrix 52 is formed on a substrate 50 having red, green and blue pixel regions "$P_R$," "$P_G$" and "$P_B$" corresponding to pixel regions on a thin film transistor substrate (not shown) facing the substrate 50. The black matrix 52 is formed of one of chromium (Cr) and opaque resin. A double layer of chromium/chromium oxide (Cr/CrOx) also can be used for forming the black matrix 52.

Figure 2B:
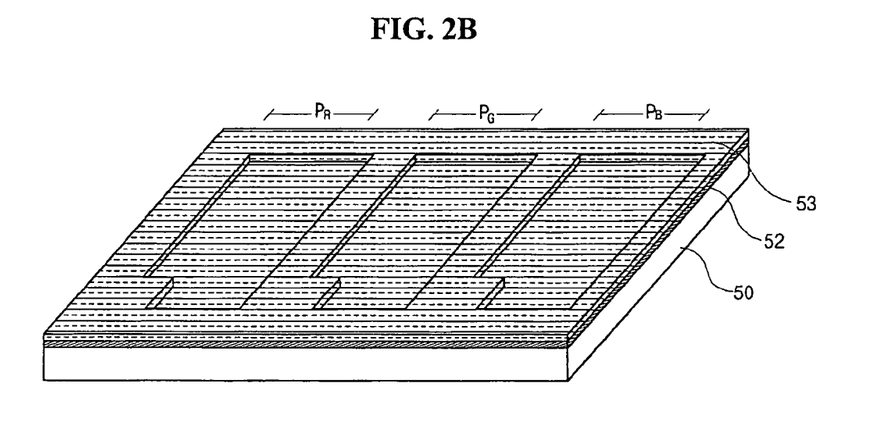

In FIG. 2B, a red resist layer 53 is formed on the entire surface of the substrate 50 having the black matrix 52 by coating a photosensitive color resist including red pigment. The photosensitive color resist is a negative type photoresist where a portion exposed to light remains after development. Even though not shown in FIG. 2B, a mask having a transmissive portion and a shielding portion is disposed over the red resist layer 53, such that the transmissive portion corresponds to the red pixel region "$P_R$." Light is then irradiated onto the red resist layer 53 through the transmissive portion of the mask and then the red resist layer 53 is developed.

Figure 2C:
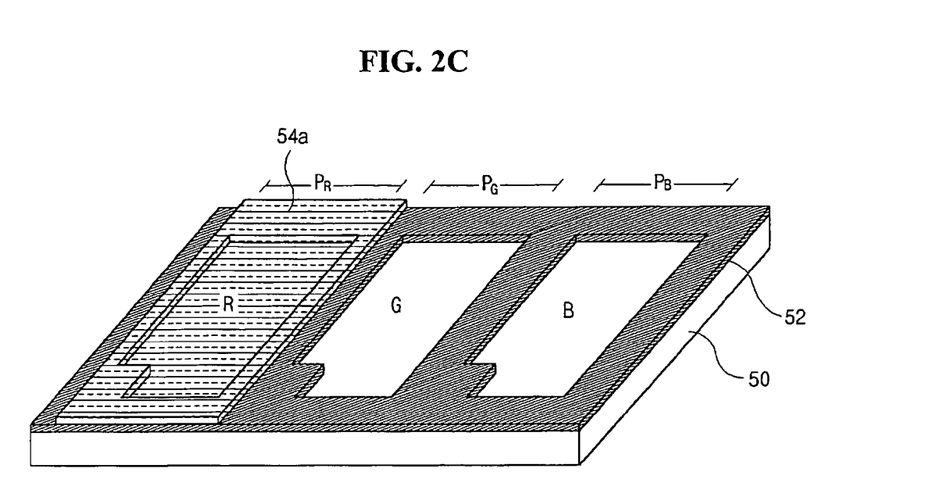

In FIG. 2C, a red sub-color filter 54a corresponding to the red pixel region "$P_R$" is formed on the black matrix 52 after the red resist layer 53 shown in FIG. 2B is developed. The red sub-color filter 54a then is cured with heat in a subsequent process.

Figure 2D:
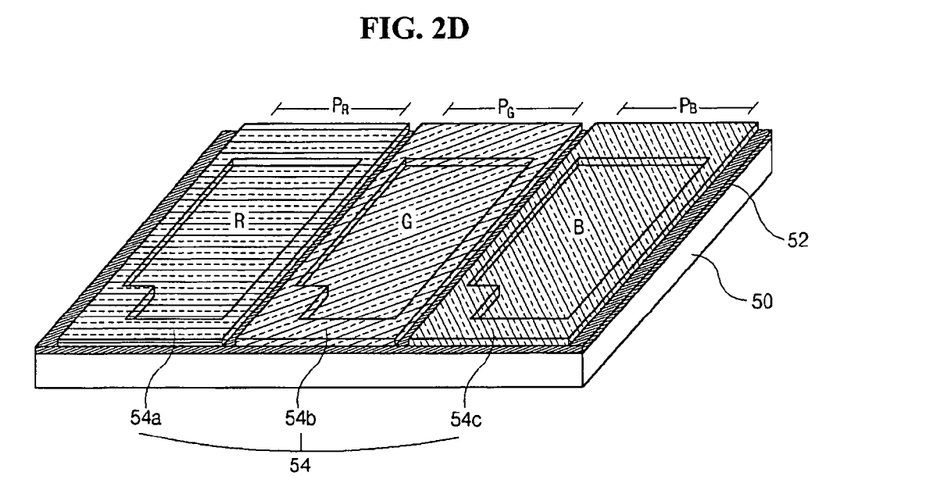

In FIG. 2D, green and blue sub-color filters 54b and 54c are formed to correspond to the green and blue pixel regions "$P_G$" and "$P_B$" by repeating a process similar to the process shown in FIGS. 2A to 2C with a photosensitive color resist including respective color pigment. Thus, a color filter layer 54 including the red, green and blue sub-color filters 54a, 54b and 54c is formed.

The above-described steps of exposing and developing are generally referred to as a photolithographic process. For instance, the process may include providing a mask on a resist layer and exposing the resist layer through a mask using an exposing apparatus. The exposing apparatus can be a lens projection exposing device where a resist layer is exposed by sequentially moving a substrate and a mask in a stepping manner to obtain multiple sub-color filters on the substrate. In other words, the mask and a platform having the substrate thereon are moved sequentially with respect to the exposing device to expose the resist layer and to form a plurality of patterns on the substrate with only one mask. However, since one large pattern is formed using several masks having a pattern corresponding to a portion of the large pattern, each mask for the stepping method has a margin for misalignment. This margin reduces an effective area of the mask. Moreover, as patterns become more miniature, the exposing apparatus including lenses and photo becomes more expensive.

SUMMARY OF THE INVENTION

Accordingly, the present invention is directed to a liquid crystal display device and a method of fabricating a liquid crystal display device that substantially obviates one or more of the problems due to limitations and disadvantages of the related art.

An object of the present invention is to provide a method of forming a color filter layer for a large-sized high-resolution liquid crystal display device.

Another object of the present invention is to provide a method of forming a color filter layer through a soft lithographic method without an exposing apparatus.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method of forming a color filter layer includes forming a first sub-color filter on a substrate by placing a first mold having at least a first groove on the substrate and injecting a first color resin into the first groove, the substrate including first, second and third regions and the first groove corresponding to the first region; forming a second sub-color filter on the substrate by placing a second mold having at least a second groove on the substrate and injecting a second color resin into the second groove, the second groove corresponding to the first and second regions; and forming a third sub-color filter on the substrate by placing a third mold having at least a third groove on the substrate and injecting a third color resin into the third groove, the third groove corresponding to the first, second and third regions.

In another aspect, the method of forming a color filter layer includes attaching a first mold having at least a first groove on a substrate and forming a first channel between the first groove and the substrate; filling the first channel with a first color resin to form a first sub-color filter; attaching a second mold having at least a second groove on the substrate and forming a second channel between the second groove and the substrate; filling the second channel with a second color resin to form a second sub-color filter; attaching a third mold having at least a third groove on the substrate and forming a third channel between the third groove and the substrate; and filling the third channel with a third color resin to form a third sub-color filter.

In a further aspect, the method of fabricating a color filter substrate for a liquid crystal display device includes forming a black matrix on a substrate having first, second and third regions; attaching a first mold having a first groove on the substrate, the first groove corresponding to the first region, the first groove and the substrate constituting a first channel; filling the first channel with a first color resin to form a first sub-color filter; curing the first sub-color filter; detaching the first mold from the substrate; attaching a second mold having a second groove on the substrate, the second groove corresponding to the first and second regions, the second groove, the first sub-color filter and the substrate constituting a second channel; filling the second channel with a second color resin to form a second sub-color filter; curing the second sub-color filter; detaching the second mold from the substrate; attaching a third mold having a third groove on the substrate, the first groove corresponding to the first region, the third groove, the first sub-color filter, the second sub-color filter and the substrate constituting a third channel; filling the third channel with a third color resin to form a third sub-color filter; curing the third sub-color filter; detaching the third mold from the substrate; and forming a common electrode on a color filter layer including the first, second and third sub-color filters.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

FIGS. 3A to 3D are schematic perspective views showing a process of forming a red sub-color filter for a color filter layer according to an embodiment.

Figure 3A:
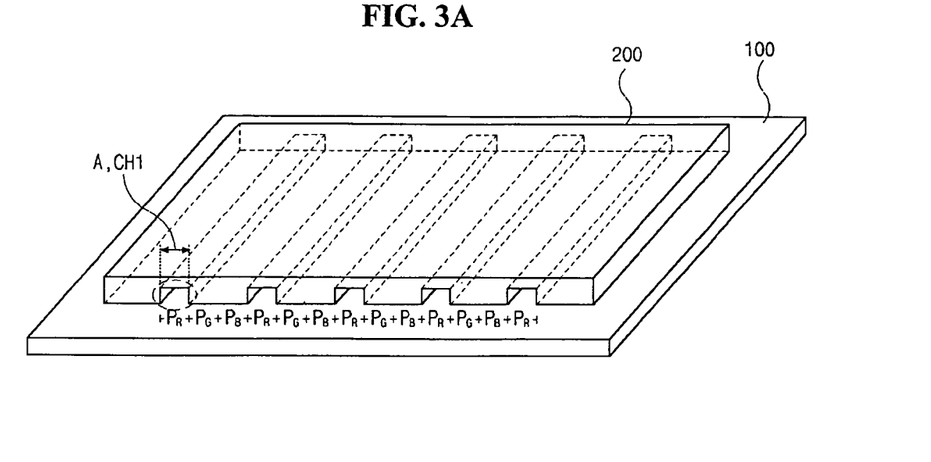
FIGS. 3A to 3D are schematic perspective views showing a process of forming a red sub-color filter for a color filter layer according to an embodiment.

In FIG. 3A, a first mold 200 may be disposed to contact a substrate 100 having red, green and blue pixel regions "$P_R$," "$P_G$" and "$P_B$." The first mold 200 may be transparent and may be formed of elastomeric polymer such as polydimethylsiloxane (PDMS). The first mold 200 may include a plurality of first grooves "A" facing the substrate 100 and corresponding to the red pixel regions "$P_R$." As a result, the first grooves "A" may constitute a plurality of first channels "CH1" corresponding to the red pixel regions "$P_R$."

Figure 3B:
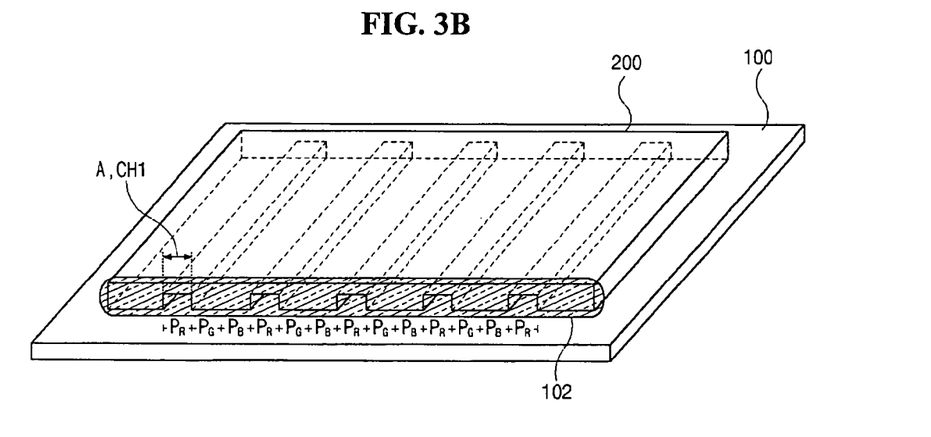

In FIG. 3B, a red color resin 102 may be then disposed to contact one end of the first mold 200, such that the red color resin 102 may be at an opening of the first grooves "A."

Figure 3C:
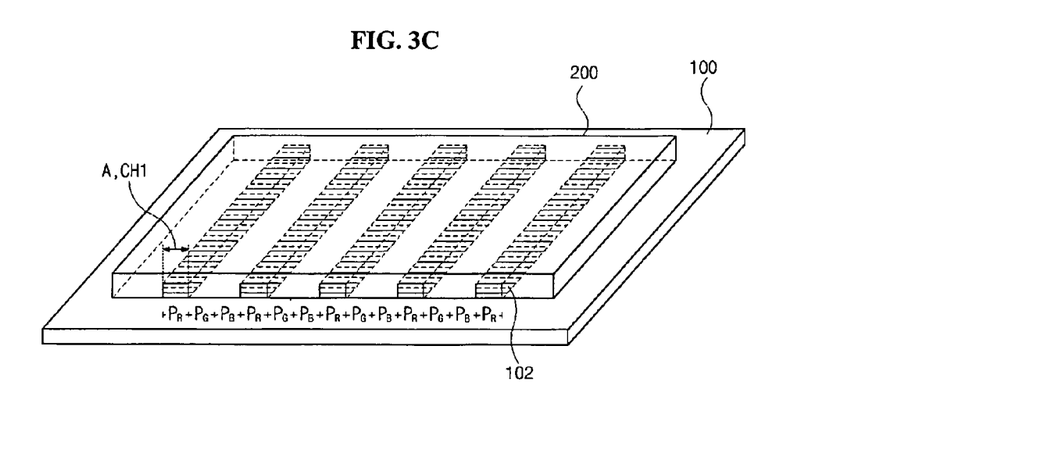

In FIG. 3C, the red color resin 102 may be injected into the first channels "CH1" between the first grooves "A" and the substrate 100 by a capillary force. Accordingly, the first channels "CH1" between the first grooves "A" and the substrate 100 may be gradually filled with the red color resin 102. Time for filling up the first channels "CH1" with the red color resin 102 may be determined by a property of the color resin and a structure of the first channels "CH1" based on the following equation.

$$t=(2\eta z^2)/(R\gamma \cos \theta),$$

where t is a time for filling up the first channel with the color resin, $\eta$ is a viscosity of the color resin, z is a length of the first channel, R is a hydraulic radius of the color resin, $\gamma$ is an interface free energy (surface tension) between the color resin and air, and $\theta$ is a contact angle between the color resin and the mold.

After filling up the first channel "CH1" with the red color resin 102, the red color resin 102 may be cured with heat or light. For example, when the red color resin 102 is a photosensitive resin, light such as ultra violet (UV) is irradiated onto the red color resin 102 through the first mold 200. Since the first mold 200 may be formed of transparent elastomeric polymer such as PDMS having a refractive index of about 1.4, light may be irradiated onto the red color resin 102 through the first mold 200. When the red color resin 102 is a heat-curable resin, the red color resin 102 is cured through a heat treatment. After curing the red color resin 102 in the first channel "CH1," the first mold 200 may be detached from the substrate 100.

Figure 3D:
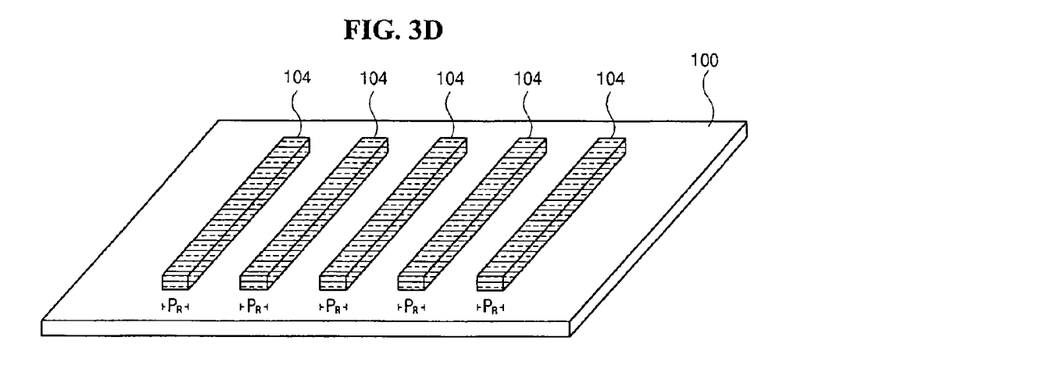

In FIG. 3D, a plurality of red sub-color filters 104 corresponding to the red pixel regions "$P_R$" may be obtained after the first mold 200 shown in FIG. 3C is detached from the substrate 100. Since the red sub-color filters 104 may be formed by filling the first channels "CH1" shown in FIG. 3C with the red color resin 102 shown in FIG. 3C, a volume of the red sub-color filter 104. may be substantially the same as the volume of the first channels "CH1" shown in FIG. 3C or the first grooves "A" shown in FIG. 3C.

FIG. 4A to 4D are schematic perspective views showing a process of forming a green sub-color filter for a color filter layer according to an embodiment.

Figure 4A:
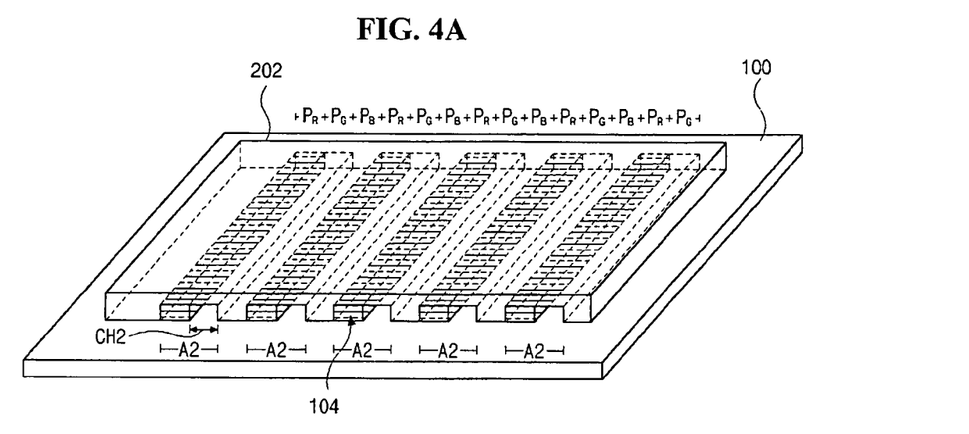
FIG. 4A to 4D are schematic perspective views showing a process of forming a green sub-color filter for a color filter layer according to an embodiment.

In FIG. 4A, a second mold 202 may be disposed to contact the substrate 100 having the red sub-color filters 104. The second mold 202 may be transparent and may be formed of elastomeric polymer such as polydimethylsiloxane (PDMS). The second mold 202 may include a plurality of second grooves "A2" facing the substrate 100 and corresponding to the red and green pixel regions "$P_R$" and "$P_G$." As a result, the second grooves "A2" may constitute a second channel "CH2" corresponding to the green pixel regions "$P_G$." In other words, the second grooves "A2" may include the red sub-color filters 104 and the second channels "CH2."

Figure 4B:
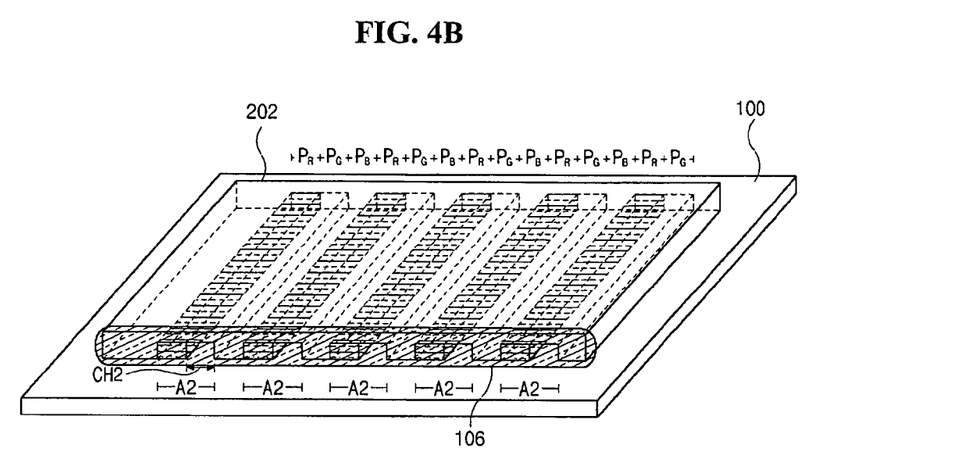

In FIG. 4B, a green color resin 106 may be then disposed to contact one end of the second mold 202, such that the green color resin 106 may be at an opening of the second grooves "A2."

Figure 4C:
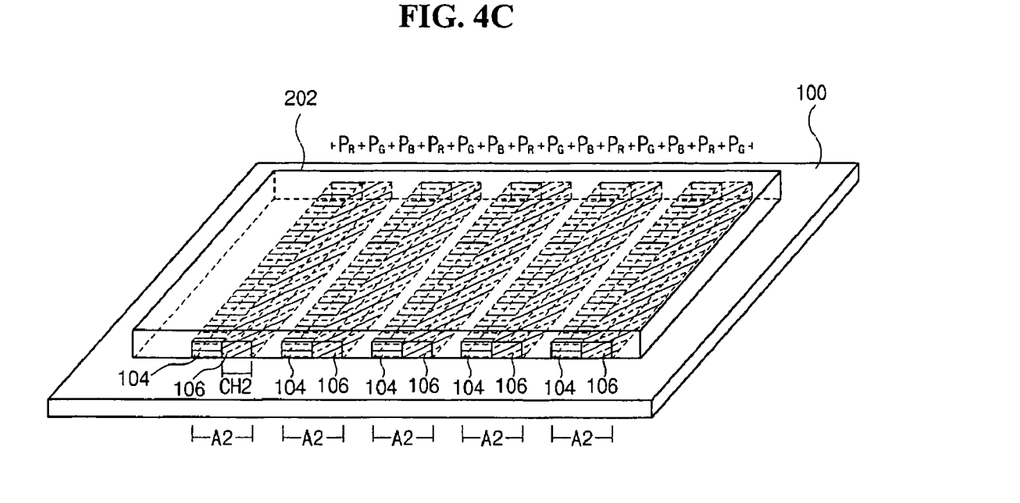

In FIG. 4C, the green color resin 106 may be injected into the second channels "CH2" between the second grooves "A2," the red sub-color filters 104 and the substrate 100 by a capillary force. Accordingly, the second channels "CH2" may be gradually filled up with the green color resin 106. Time for filling up the second channels "CH2" with the green color resin 106 may be determined by a property of the color resin and a structure of the channel based on the above-mentioned equation. After filling up the second channels "CH2" with the green color resin 106, the green color resin 106 may be cured with heat or light.

Figure 4D:
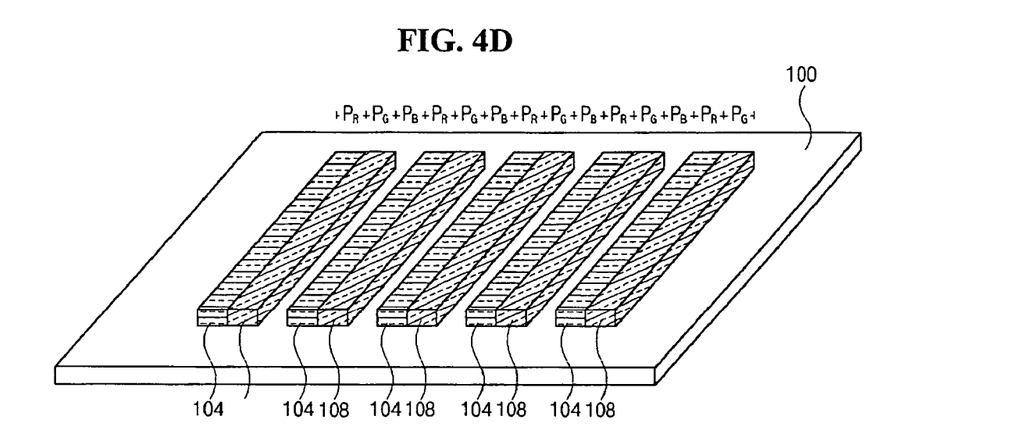

In FIG. 4D, a plurality of green sub-color filters 108 corresponding to the green pixel regions "$P_G$" may be obtained after the second mold 202 shown in FIG. 4C is detached from the substrate 100. A sum of volumes of the red and green sub-color filters 104 and 108 may be substantially the same as a volume of the second grooves "A2" shown in FIG. 4C FIG. 5A to 5C are schematic perspective views showing a process of forming a blue sub-color filter for a color filter layer according to an embodiment.

Figure 5A:
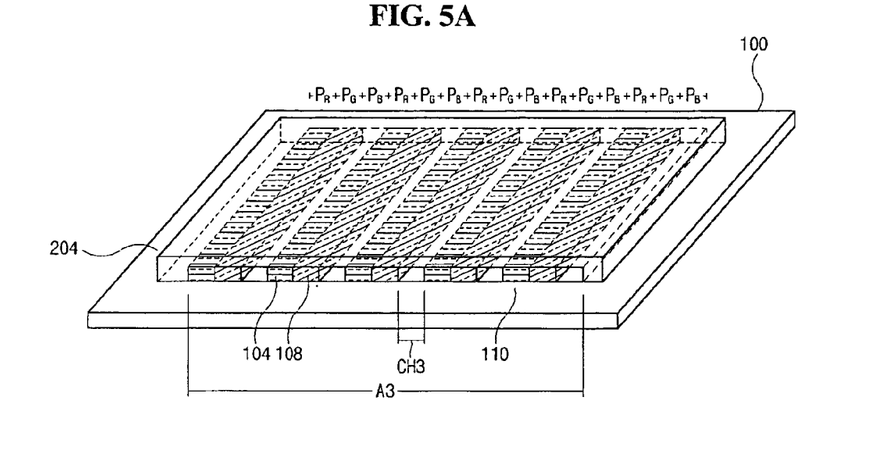
FIG. 5A to 5C are schematic perspective views showing a process of forming a blue sub-color filter for a color filter layer according to an embodiment.

In FIG. 5A, a third mold 204 may be disposed to contact the substrate 100 having the red and green sub-color filters 104 and 108. The third mold 204 may be transparent and may be formed of elastomeric polymer such as polydimethylsiloxane (PDMS). The third mold 204 may include a plurality of third grooves "A3" facing the substrate 100 and corresponding to the red, green and blue pixel regions "$P_R$," "$P_G$," and "$P_B$." As a result, the third grooves "A3" may constitute a plurality of third channels "CH3" corresponding to the blue pixel region "$P_B$." In other words, the third grooves "A3" may include the red sub-color filters 104, the green sub-color filters 108 and the third channels "CH3."

Figure 5B:
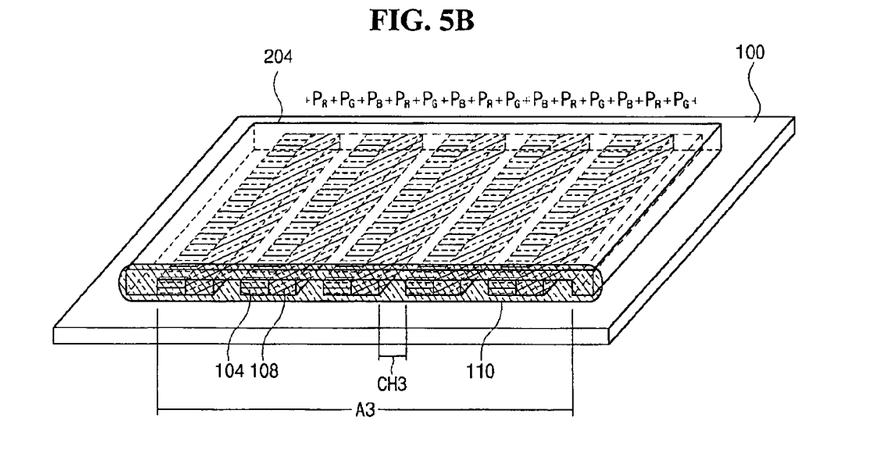

In FIG. 5B, a blue color resin 110 may be disposed to contact one end of the third mold 204, such that the blue color resin 110 may be at an opening of the third grooves "A3." Even though not shown, the blue color resin 110 may be injected into the third channels "CH3" between the third grooves "A3," the red sub-color filters 104, the green sub-color filters 108 and the substrate 100 by a capillary force. Accordingly, the third channels "CH3" may be gradually filled up with the blue color resin 110. Time for filling up the third channels "CH3" with the blue color resin 110 may be determined by a property of the color resin and a structure of the channel. After filling up the third channels "CH3" with the blue color resin 110, the blue color resin 110 may be cured with heat or light.

Figure 5C:
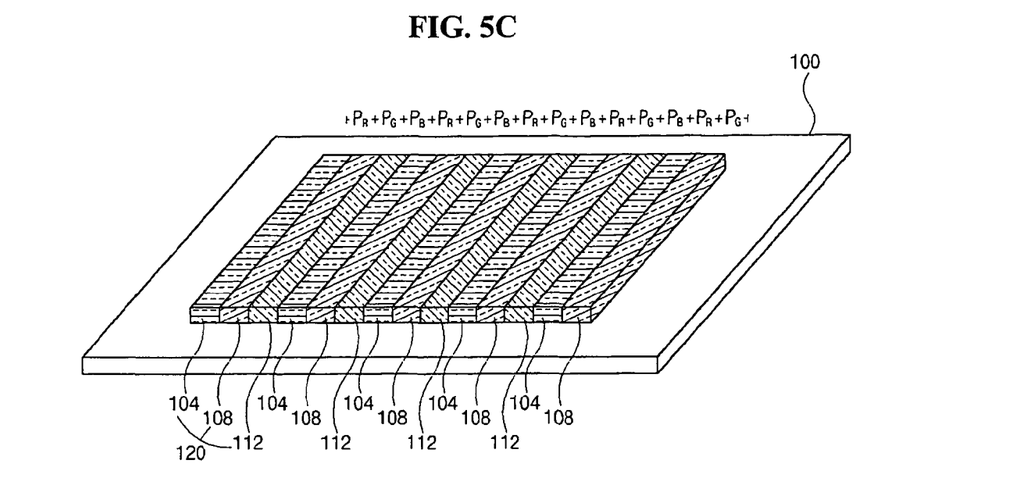

In FIG. 5C, a plurality of blue sub-color filters 112 corresponding to the blue pixel regions "$P_B$" may be obtained after the third mold shown in FIG. 5B is detached from the substrate 100. A sum of volumes of the red, green and blue sub-color filters 104, 108 and 112 may be substantially the same as a volume of the third groove "A3" shown in FIG. 5B. In addition, a color filter layer 120 including red, green and blue sub-color filters 104, 108 and 112 may be completed where the red, green and blue sub-color filters 104, 108 and 112 having a stripe shape may be alternately formed on an entire surface of the substrate 100.

Further, color purity of the color filter layer of the present invention may be easily changed by changing types of color resin used therein. In addition, even though the above-illustrated method for forming a color filter layer 120 is for a liquid crystal display device, the method of forming the color filter layer according to the present invention may be applied to other devices including a color filter layer. Moreover, even though not shown in figures, the red, green and blue sub-color filters may be formed to have different shapes and thickness from each other by changing designs of the molds, for example, by differing heights of the grooves in the molds.

Figure 6:
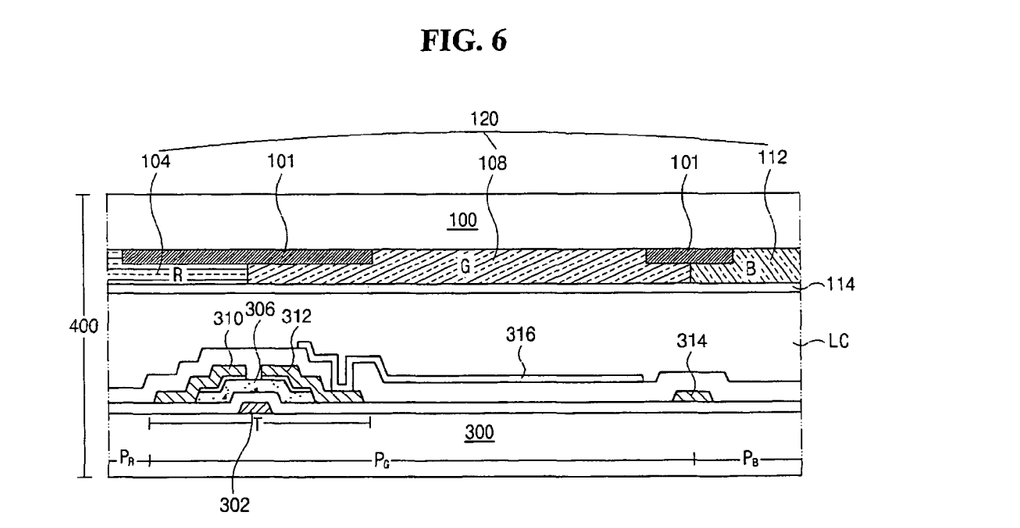
FIG. 6 is a schematic cross-sectional view of a liquid crystal display device having a color filter layer formed through a method according to an embodiment.

FIG. 6 is a schematic cross-sectional view of a liquid crystal display device having a color filter layer formed through a method according to an embodiment. In FIG. 6, a liquid crystal display (LCD) device 400 may include first and second substrates 100 and 300 facing and spaced apart from each other, and a liquid crystal layer "LC" interposed between the first and second substrates 100 and 300. The first and second substrates 100 and 300 may include red, green and blue pixel regions "P$_R$," "P$_G$" and "P$_B$." A gate line (not shown), a data line 314 and a thin film transistor (TFT) "T" connected to the gate line and the data line 314 may be formed on a top surface of the second substrate 300 in each pixel region "P$_R$," "P$_G$" and "P$_B$." The TFT "T" may include a gate electrode 302 connected to the gate line, an active layer 306, a source electrode 310 connected to the data line 314 and a drain electrode 312 spaced apart from the source electrode 310. A transparent pixel electrode 316 may be formed to contact the drain electrode 312 in each pixel region "P$_R$," "P$_G$" and "P$_B$."

A black matrix 101 may be formed on a bottom surface of the first substrate 100 to correspond to borders between the pixel regions "P$_R$," "P$_G$" and "P$_B$." A color filter layer 120 including red, green and blue sub-color filters 104, 108 and 112 may be formed on the black matrix 101 through a method using molds of elastomeric polymer such as polydimethylsiloxane (PDMS). The red, green and blue sub-color filters 104, 108 and 112 may correspond to the red, green and blue pixel regions "P$_R$," "P$_G$" and "P$_B$," respectively. A common electrode 114 may be formed on the color filter layer 120.

In an LCD device according to the present invention, since a color filter layer is formed through a soft lithographic process using a mold of an elastomeric polymer such as PDMS, a total process of forming the LCD device is simplified. The soft lithographic process using a mold of an elastomeric polymer may be used not only for an LCD device but also for other devices such as electroluminescent display device. In addition, a color filter layer including sub-color filters having thickness may be easily formed through a soft lithographic process using molds with grooves of different heights. In a plane view, a color filter layer formed through a soft lithographic process using a mold of an elastomeric polymer such as PDMS also may have one of a zigzag shape and a round shape by using molds with grooves of desired shapes.

Consequently, since a color filter layer is formed through a soft lithographic process using a mold of an elastomeric polymer such as PDMS without using an exposing apparatus, a production cost is reduced. In addition, since a process of forming a color filter layer is simplified, a process time is reduced and a production yield is improved. Moreover, since a color filter layer is formed to have a length up to about 2 meters using a capillary force, a soft lithographic process using a mold of an elastomeric polymer such as PDMS may be applied to a large-sized LCD device having high resolution.

It will be apparent to those skilled in the art that various modifications and variations can be made in the method of forming color filter layer and the method of fabricating liquid crystal display device using the same without departing from the spirit or scope of the invention. Thus, it is intended that the present invention covers the modifications and variations of this invention provided they come within the scope of the appended claims and their equivalents.

What is claimed is:

1. A method of forming a color filter layer, comprising:
    forming a first sub-color filter on a substrate by placing a first mold having at least a first groove on the substrate such that the first groove and the substrate constitute a first channel and injecting a first color resin into the first channel for a first time, the substrate including first, second and third regions and the first groove corresponding to the first region, wherein injecting the first color resin into the first channel is performed after placing the first mold on the substrate;
    forming a second sub-color filter on the substrate by placing a second mold having at least a second groove on the substrate such that the second groove, the first sub-color filter and the substrate constitute a second channel and injecting a second color resin into the second channel for a second time, the second groove corresponding to the first and second regions, the first sub-color filter used as one sidewall of the second channel and the second mold used as the other sidewall of the second channel while injecting the second color resin, wherein injecting the second color resin into the second channel is performed after placing the second mold on the substrate; and
    forming a third sub-color filter on the substrate by placing a third mold having at least a third groove on the substrate such that the third groove, the first sub-color filter, the second sub-color filter and the substrate constitute a third channel and injecting a third color resin into the third channel for a third time, the third groove corresponding to the first, second and third regions, the second sub-color filter used as one sidewall of the third channel and the third mold used as the other sidewall of the third channel while injecting the third color resin, wherein injecting the third color resin into the third channel is performed after placing the third mold on the substrate wherein the second groove has a volume greater than the first groove and smaller than the third groove.

2. The method according to claim 1, wherein the first color resin is injected through an opening of the first groove, the second color resin is injected through an opening of the second groove, and the third color resin is injected through an opening of the third groove.

3. The method according to claim 1,
    wherein the forming the first sub-color filter on the substrate further comprises:
        curing the first color resin with one of heat and light; and
        detaching the first mold from the substrate,
    wherein the forming the second sub-color filter on the substrate further comprises:
        curing the second color resin with one of heat and light; and
        detaching the second mold from the substrate, and
    wherein the forming the third sub-color filter on the substrate further comprises:
        curing the third color resin with one of heat and light; and
        detaching the third mold from the substrate.

4. The method according to claim 1, wherein the first mold, the second mold and the third mold include a transparent material.

5. The method according to claim 1, wherein the second groove covers the first sub-color filter when the second mold is placed on the substrate.

6. The method according to claim 1, wherein the third groove covers the first and second sub-color filters when the third mold is placed on the substrate.

7. The method according to claim 1, wherein the first, second and third sub-color filters have one of stripe shape, round shape and zigzag shape.

8. The method according to claim 1, further comprises forming a black matrix over the substrate.

9. The method according to claim 1, wherein the first, second and third regions correspond to pixel regions of a liquid crystal device.

10. The method according to claim 1, wherein the first, second and third color resins are injected by a capillary force.

11. A method of forming a color filter layer, comprising:
attaching a first mold having at least a first groove on a substrate and forming a first channel by the first groove and the substrate;
filling the first channel with a first color resin for a first time to form a first sub-color filter after attaching the first mold on the substrate;
attaching a second mold having at least a second groove on the substrate and forming a second channel by the second groove, the first sub-color filter and the substrate;
filling the second channel with a second color resin for a second time to form a second sub-color filter after attaching the second mold on the substrate, the first sub-color filter used as one sidewall of the second channel and the second mold used as the other sidewall of the second channel while filling the second channel with the second color resin;
attaching a third mold having at least a third groove on the substrate and forming a third channel by the third groove, the first sub-color filter, the second color-filter and the substrate; and
filling the third channel with a third color resin for a third time to form a third sub-color filter after attaching the third mold on the substrate, the second sub-color filter used as one sidewall of the third channel and the third mold used as the other sidewall of the third channel while filling the third channel with the third color resin wherein the second groove has a volume greater than the first groove and smaller than the third groove.

12. The method according to claim 11, wherein the first mold, the second mold and the third mold include a transparent material.

13. The method according to claim 11, further comprises:
curing the first sub-color filter with one of heat and light;
detaching the first mold from the substrate;
curing the second sub-color filter with one of heat and light;
detaching the second mold from the substrate;
curing the third sub-color filter with one of heat and light; and
detaching the third mold from the substrate.

14. The method according to claim 11, wherein the first, second and third channels are filled by a capillary force.

15. The method according to claim 11, wherein a volume of the first groove is substantially the same as a volume of the first sub-color filter, a volume of the second groove is substantially the same as a sum of volumes of the first and second sub-color filters, and a volume of the third groove is substantially the same as a sum of volumes of the first, second and third sub-color filters.

16. A method of fabricating a color filter substrate for a liquid crystal display device, comprising:
forming a black matrix on a substrate having first, second and third regions;
attaching a first mold having a first groove on the substrate, the first groove corresponding to the first region, wherein the first groove and the substrate constitute a first channel;
filling the first channel with a first color resin for a first time to form a first sub-color filter after attaching the first mold on the substrate;
curing the first sub-color filter;
detaching the first mold from the substrate;
attaching a second mold having a second groove on the substrate, the second groove corresponding to the first and second regions, wherein the second groove, the first sub-color filter and the substrate constitute a second channel;
filling the second channel with a second color resin for a second time to form a second sub-color filter after attaching the second mold on the substrate, the first sub-color filter used as one sidewall of the second channel and the second mold used as the other sidewall of the third channel while filling the second channel with the second color resin;
curing the second sub-color filter;
detaching the second mold from the substrate;
attaching a third mold having a third groove on the substrate, the third groove corresponding to the first, second and third regions, wherein the third groove, the first sub-color filter, the second sub-color filter and the substrate constitute a third channel, and wherein the second groove has a volume greater than the first groove and smaller than the third groove;
filling the third channel with a third color resin for a third time to form a third sub-color filter after attaching the third mold on the substrate, the second sub-color filter used as one sidewall of the third channel and the third mold used as the other sidewall of the third channel while filling the third channel with the third color resin;
curing the third sub-color filter;
detaching the third mold from the substrate; and
forming a common electrode on a color filter layer including the first, second and third sub-color filters.

17. The method according to claim 16, wherein the first mold, the second mold and the third mold include a transparent material.

18. The method according to claim 17, wherein the transparent material includes polydimethylsiloxane (PDMS).

19. The method according to claim 16, wherein the first sub-color filter is cured by irradiating light through the first mold, the second sub-color filter is cured by irradiating light through the second mold, and the third sub-color filter is cured by irradiating light through the third mold.

20. The method according to claim 16, wherein the first, second and third regions correspond to pixel regions of the liquid crystal device.

* * * * *